United States Patent
Ritchie et al.

(10) Patent No.: US 8,647,484 B2
(45) Date of Patent: *Feb. 11, 2014

(54) TARGET FOR SPUTTERING CHAMBER

(75) Inventors: Alan Alexander Ritchie, Pleasanton, CA (US); Donny Young, San Jose, CA (US); Ilyoung (Richard) Hong, San Jose, CA (US); Kathleen A. Scheible, San Francisco, CA (US); Umesh Kelkar, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1214 days.

This patent is subject to a terminal disclaimer.

(21) Appl. No.: 11/558,929

(22) Filed: Nov. 12, 2006

(65) Prior Publication Data

US 2007/0170052 A1 Jul. 26, 2007

Related U.S. Application Data

(60) Provisional application No. 60/739,658, filed on Nov. 25, 2005, provisional application No. 60/788,378, filed on Mar. 30, 2006.

(51) Int. Cl.
*C23C 14/34* (2006.01)

(52) U.S. Cl.
USPC ............... 204/298.09; 204/298.12; 204/298.2

(58) Field of Classification Search
USPC ............. 204/298.01, 298.09, 298.12, 298.13, 204/298.16, 298.2

See application file for complete search history.

(56) References Cited

U.S. PATENT DOCUMENTS

| | | | |
|---|---|---|---|
| 3,716,462 A | 2/1973 | Jensen | |
| 3,725,220 A | 4/1973 | Kessler et al. | |
| 3,748,253 A * | 7/1973 | Provenzano | 204/298.09 |
| 4,374,722 A | 2/1983 | Zega | |
| 4,415,421 A | 11/1983 | Sasanuma | |
| 4,430,173 A | 2/1984 | Boudot | |
| 4,505,947 A | 3/1985 | Vukanovic et al. | |
| 4,545,882 A | 10/1985 | Kelvey | |
| 4,606,802 A | 8/1986 | Kobayashi et al. | |
| 4,872,964 A * | 10/1989 | Suzuki et al. | 204/298.2 |
| 4,905,886 A | 3/1990 | Kennedy et al. | |
| 4,924,436 A | 5/1990 | Strand | |

(Continued)

FOREIGN PATENT DOCUMENTS

| | | |
|---|---|---|
| CN | 1527887 A | 9/2004 |
| EP | 1350861 | 10/2003 |

(Continued)

OTHER PUBLICATIONS

Properties of C18200, www.copper.org, 2005.*

(Continued)

*Primary Examiner* — Keith Hendricks
*Assistant Examiner* — John Brayton
(74) *Attorney, Agent, or Firm* — Ashok K. Janah

(57) ABSTRACT

A sputtering chamber has a sputtering target comprising a backing plate and a sputtering plate. The backing plate has a groove. The sputtering plate comprises a cylindrical mesa having a plane, and an annular inclined rim surrounding the cylindrical mesa. In one version, the backing plate comprises a material having a high thermal conductivity and a low electrical resistivity. In another version, the backing plate comprises a backside surface with a single groove or a plurality of grooves.

24 Claims, 9 Drawing Sheets

(56) References Cited

U.S. PATENT DOCUMENTS

| | | | |
|---|---|---|---|
| 4,983,269 A | 1/1991 | Wegmann | |
| 4,995,958 A | 2/1991 | Anderson et al. | |
| 5,041,194 A | 8/1991 | Mori et al. | |
| 5,166,758 A | 11/1992 | Ovshinsky et al. | |
| 5,215,639 A | 6/1993 | Boys | |
| 5,314,597 A | 5/1994 | Harra | |
| 5,342,496 A | 8/1994 | Stellrecht | |
| 5,407,551 A | 4/1995 | Sieck et al. | |
| 5,409,590 A | 4/1995 | Hurwitt et al. | |
| 5,433,835 A | 7/1995 | Demaray et al. | |
| 5,435,965 A | 7/1995 | Mashima et al. | |
| 5,458,759 A | 10/1995 | Hosokawa et al. | |
| 5,487,822 A | 1/1996 | Demaray et al. | |
| 5,487,823 A | 1/1996 | Sawada et al. | |
| 5,490,913 A | 2/1996 | Schertler et al. | |
| 5,538,603 A | 7/1996 | Guo | |
| 5,565,071 A | 10/1996 | Demaray et al. | |
| 5,595,337 A | 1/1997 | Demaray et al. | |
| 5,595,938 A | 1/1997 | Miyazaki | |
| 5,628,889 A * | 5/1997 | Gardell et al. | 204/298.09 |
| 5,643,422 A | 7/1997 | Yamada | |
| 5,685,959 A | 11/1997 | Bourez et al. | |
| 5,693,203 A | 12/1997 | Ohhashi et al. | |
| 5,695,825 A | 12/1997 | Scruggs | |
| 5,714,768 A | 2/1998 | Ovshinsky et al. | |
| 5,772,858 A | 6/1998 | Tepman | |
| 5,789,717 A | 8/1998 | Imaizumi et al. | |
| 5,798,029 A | 8/1998 | Morita | |
| 5,799,860 A | 9/1998 | Demaray et al. | |
| 5,803,342 A | 9/1998 | Kardokus | |
| 5,830,327 A | 11/1998 | Kolnekow | |
| 5,876,573 A | 3/1999 | Moslehi et al. | |
| 5,879,524 A | 3/1999 | Hurwitt et al. | |
| 5,887,481 A | 3/1999 | Leroy et al. | |
| 5,914,018 A | 6/1999 | Fu et al. | |
| 5,919,345 A | 7/1999 | Tepman | |
| 5,942,089 A | 8/1999 | Sproul et al. | |
| 5,963,778 A | 10/1999 | Stellrecht | |
| 6,001,426 A | 12/1999 | Witherspoon et al. | |
| 6,010,583 A | 1/2000 | Annavarapu et al. | |
| 6,024,852 A | 2/2000 | Tamura et al. | |
| 6,040,545 A | 3/2000 | Taki et al. | |
| 6,042,706 A | 3/2000 | Fu | |
| 6,059,945 A | 5/2000 | Fu et al. | |
| 6,071,323 A | 6/2000 | Kawaguchi | |
| 6,071,389 A | 6/2000 | Zhang | |
| 6,073,830 A | 6/2000 | Hunt et al. | |
| 6,086,735 A | 7/2000 | Gilman et al. | |
| 6,139,701 A | 10/2000 | Pavate et al. | |
| 6,146,509 A | 11/2000 | Aragon | |
| 6,149,776 A | 11/2000 | Tang et al. | |
| 6,179,973 B1 | 1/2001 | Lai et al. | |
| 6,183,614 B1 | 2/2001 | Fu | |
| 6,183,686 B1 | 2/2001 | Bardus et al. | |
| 6,187,682 B1 | 2/2001 | Denning et al. | |
| 6,190,516 B1 | 2/2001 | Xiong et al. | |
| 6,199,259 B1 | 3/2001 | Demaray et al. | |
| 6,221,217 B1 | 4/2001 | Moslehi et al. | |
| 6,227,435 B1 | 5/2001 | Lazarz et al. | |
| 6,231,725 B1 | 5/2001 | Nulman et al. | |
| 6,238,528 B1 | 5/2001 | Xu et al. | |
| 6,244,121 B1 | 6/2001 | Hunter | |
| 6,251,242 B1 | 6/2001 | Fu et al. | |
| 6,267,851 B1 | 7/2001 | Hosokawa | |
| 6,274,008 B1 | 8/2001 | Gopalraja et al. | |
| 6,277,249 B1 | 8/2001 | Gopalraja et al. | |
| 6,277,263 B1 | 8/2001 | Chen | |
| 6,283,357 B1 | 9/2001 | Kulkarni et al. | |
| 6,287,437 B1 | 9/2001 | Pandhumsoporn et al. | |
| 6,299,740 B1 | 10/2001 | Hieronymi et al. | |
| 6,309,556 B1 | 10/2001 | Joyce et al. | |
| 6,337,151 B1 | 1/2002 | Uzoh et al. | |
| 6,337,453 B1 | 1/2002 | Miller et al. | |
| 6,338,781 B1 | 1/2002 | Sichmann et al. | |
| 6,340,415 B1 | 1/2002 | Raajimakers et al. | |
| 6,344,114 B1 | 2/2002 | Sichmann et al. | |
| 6,346,177 B2 | 2/2002 | Leiphart | |
| 6,365,010 B1 | 4/2002 | Hollars | |
| 6,406,599 B1 | 6/2002 | Subramani et al. | |
| 6,409,965 B1 | 6/2002 | Nagata et al. | |
| 6,413,382 B1 | 7/2002 | Wang et al. | |
| 6,413,387 B1 | 7/2002 | Shi et al. | |
| 6,413,858 B1 | 7/2002 | Chopra | |
| 6,416,634 B1 | 7/2002 | Mostovoy et al. | |
| 6,419,806 B1 | 7/2002 | Holcomb et al. | |
| 6,436,251 B2 | 8/2002 | Gopalraja et al. | |
| 6,437,383 B1 | 8/2002 | Xu | |
| 6,440,221 B2 | 8/2002 | Shamouilian et al. | |
| 6,444,104 B2 | 9/2002 | Gopalraja et al. | |
| 6,451,177 B1 | 9/2002 | Gopalraja et al. | |
| 6,454,919 B1 | 9/2002 | Sundarrajan et al. | |
| 6,464,889 B1 | 10/2002 | Lee et al. | |
| 6,475,854 B2 | 11/2002 | Narwankar et al. | |
| 6,482,302 B1 | 11/2002 | Li et al. | |
| 6,487,910 B1 | 12/2002 | Leybovich | |
| 6,491,801 B1 | 12/2002 | Gung | |
| 6,494,098 B1 | 12/2002 | Leybovich | |
| 6,495,009 B1 | 12/2002 | Gung | |
| 6,500,321 B1 | 12/2002 | Ashtiani et al. | |
| 6,507,061 B1 | 1/2003 | Klersy et al. | |
| 6,518,086 B2 | 2/2003 | Beck et al. | |
| 6,537,428 B1 | 3/2003 | Xiong et al. | |
| 6,579,431 B1 | 6/2003 | Bolcavage et al. | |
| 6,599,405 B2 | 7/2003 | Hunt et al. | |
| 6,610,959 B2 | 8/2003 | Carlson et al. | |
| 6,619,537 B1 | 9/2003 | Zhang et al. | |
| 6,620,296 B2 | 9/2003 | Gogh et al. | |
| 6,623,610 B1 | 9/2003 | Onishi | |
| 6,627,050 B2 | 9/2003 | Miller et al. | |
| 6,635,219 B2 | 10/2003 | Wen et al. | |
| 6,652,668 B1 | 11/2003 | Perry et al. | |
| 6,677,254 B2 | 1/2004 | Narwankar et al. | |
| 6,699,375 B1 | 3/2004 | Crocker | |
| 6,708,870 B2 | 3/2004 | Koenigsmann et al. | |
| 6,709,557 B1 | 3/2004 | Kailasam et al. | |
| 6,716,321 B2 | 4/2004 | Gilmore et al. | |
| 6,730,196 B2 | 5/2004 | Wang et al. | |
| 6,739,196 B2 | 5/2004 | Leybovich | |
| 6,743,342 B2 | 6/2004 | Wang | |
| 6,749,103 B1 | 6/2004 | Ivanov et al. | |
| 6,750,156 B2 | 6/2004 | Le et al. | |
| 6,759,267 B2 | 7/2004 | Chen | |
| 6,776,879 B2 | 8/2004 | Yamamoto et al. | |
| 6,797,362 B2 | 9/2004 | Parfeniuk et al. | |
| 6,824,652 B2 | 11/2004 | Park | |
| 6,840,427 B2 | 1/2005 | Ivanov | |
| 6,841,050 B2 | 1/2005 | Hong et al. | |
| 6,848,608 B2 | 2/2005 | Wickersham | |
| 6,852,202 B2 | 2/2005 | Miller et al. | |
| 6,858,116 B2 | 2/2005 | Okabe et al. | |
| 6,858,277 B1 | 2/2005 | Yamada et al. | |
| 6,872,284 B2 | 3/2005 | Ivanov et al. | |
| 6,887,356 B2 | 5/2005 | Ford et al. | |
| 6,916,407 B2 | 7/2005 | Voser et al. | |
| 6,946,408 B2 | 9/2005 | Le et al. | |
| 6,955,852 B2 | 10/2005 | Ivanov | |
| 6,992,261 B2 | 1/2006 | Kachalov et al. | |
| 7,037,762 B2 | 5/2006 | Joo et al. | |
| 7,063,773 B2 | 6/2006 | Ivanov et al. | |
| 7,115,193 B2 | 10/2006 | Takahashi | |
| 7,115,927 B2 | 10/2006 | Hideki et al. | |
| 7,131,883 B2 | 11/2006 | Park et al. | |
| 7,146,703 B2 | 12/2006 | Ivanov | |
| 7,175,802 B2 | 2/2007 | Sandlin et al. | |
| 7,297,247 B2 | 11/2007 | Subramani et al. | |
| 7,316,763 B2 | 1/2008 | Hosokawa et al. | |
| 7,331,250 B2 | 2/2008 | Hunter | |
| 7,476,289 B2 | 1/2009 | White | |
| 7,504,008 B2 | 3/2009 | Doan et al. | |
| 7,550,055 B2 | 6/2009 | Le et al. | |
| 7,550,066 B2 | 6/2009 | Tepman | |
| 7,588,668 B2 | 9/2009 | Ye et al. | |
| 7,644,745 B2 | 1/2010 | Le et al. | |
| 7,799,190 B2 * | 9/2010 | Mullapudi et al. | 204/298.09 |

(56) References Cited

U.S. PATENT DOCUMENTS

| | | | |
|---|---|---|---|
| 7,901,552 B2 * | 3/2011 | Pavloff | .................... 204/298.09 |
| 2001/0030172 A1 | 10/2001 | Takahashi et al. | |
| 2001/0035237 A1 | 11/2001 | Nagano et al. | |
| 2001/0035238 A1 | 11/2001 | Nagano et al. | |
| 2001/0045353 A1 | 11/2001 | Hieronymi et al. | |
| 2002/0014289 A1 | 2/2002 | Nagano et al. | |
| 2002/0033330 A1 | 3/2002 | Demaray et al. | |
| 2002/0075631 A1 | 6/2002 | Singh et al. | |
| 2002/0081804 A1 | 6/2002 | Gill et al. | |
| 2002/0083571 A1 | 7/2002 | Lee et al. | |
| 2002/0100680 A1 | 8/2002 | Yamamoto et al. | |
| 2002/0112955 A1 | 8/2002 | Aimone et al. | |
| 2002/0121436 A1 * | 9/2002 | Gogh et al. | ............... 204/298.12 |
| 2003/0035906 A1 | 2/2003 | Memarian et al. | |
| 2003/0102207 A1 | 6/2003 | Wu et al. | |
| 2003/0124748 A1 | 7/2003 | Summerfelt et al. | |
| 2003/0127319 A1 | 7/2003 | Demaray et al. | |
| 2003/0175142 A1 | 9/2003 | Milonopoulou et al. | |
| 2003/0196890 A1 | 10/2003 | Le et al. | |
| 2003/0218054 A1 | 11/2003 | Koenigsmann et al. | |
| 2004/0016635 A1 | 1/2004 | Ford et al. | |
| 2004/0020769 A1 | 2/2004 | Ivanov et al. | |
| 2004/0035698 A1 | 2/2004 | Ivanov et al. | |
| 2004/0056070 A1 | 3/2004 | Ivanov | |
| 2004/0079634 A1 | 4/2004 | Wickersham et al. | |
| 2004/0089542 A1 | 5/2004 | Liu et al. | |
| 2004/0113364 A1 | 6/2004 | Ivanov | |
| 2004/0115945 A1 | 6/2004 | Lowrey et al. | |
| 2004/0144638 A1 | 7/2004 | Jaso | |
| 2004/0165422 A1 | 8/2004 | Hideki et al. | |
| 2004/0222088 A1 | 11/2004 | Subramani et al. | |
| 2004/0256226 A1 | 12/2004 | Wickersham | |
| 2005/0002227 A1 | 1/2005 | Hideki et al. | |
| 2005/0011749 A1 | 1/2005 | Kachalov et al. | |
| 2005/0029094 A1 | 2/2005 | Watanabe et al. | |
| 2005/0029502 A1 | 2/2005 | Hudgens | |
| 2005/0061857 A1 | 3/2005 | Hunt et al. | |
| 2005/0067469 A1 | 3/2005 | Facey et al. | |
| 2005/0072668 A1 | 4/2005 | Kennedy et al. | |
| 2005/0089699 A1 | 4/2005 | Lin et al. | |
| 2005/0092604 A1 | 5/2005 | Ivanov | |
| 2005/0115045 A1 * | 6/2005 | Koenigsmann et al. | ........ 29/446 |
| 2005/0133361 A1 | 6/2005 | Ding et al. | |
| 2005/0147150 A1 | 7/2005 | Wickersham et al. | |
| 2005/0161322 A1 | 7/2005 | Smathers | |
| 2005/0178653 A1 | 8/2005 | Fisher | |
| 2006/0021870 A1 | 2/2006 | Tsai et al. | |
| 2006/0070876 A1 | 4/2006 | Wu et al. | |
| 2006/0081459 A1 | 4/2006 | Tsai et al. | |
| 2006/0099126 A1 | 5/2006 | Hosono et al. | |
| 2006/0105182 A1 | 5/2006 | Brueckner et al. | |
| 2006/0108217 A1 | 5/2006 | Krempel-Hesse et al. | |
| 2006/0188742 A1 | 8/2006 | West et al. | |
| 2006/0266639 A1 | 11/2006 | Le et al. | |
| 2006/0283703 A1 | 12/2006 | Lee et al. | |
| 2006/0289305 A1 | 12/2006 | White | |
| 2007/0056845 A1 | 3/2007 | Ye et al. | |
| 2007/0102286 A1 | 5/2007 | Scheible et al. | |
| 2007/0125646 A1 | 6/2007 | Young et al. | |
| 2007/0170052 A1 | 7/2007 | Ritchie et al. | |
| 2007/0173059 A1 | 7/2007 | Young et al. | |
| 2007/0215463 A1 | 9/2007 | Parkhe | |
| 2007/0246346 A1 | 10/2007 | Subramani et al. | |
| 2008/0308416 A1 | 12/2008 | Allen et al. | |
| 2009/0090620 A1 | 4/2009 | Pavloff | |
| 2009/0107834 A1 | 4/2009 | Ye et al. | |
| 2009/0114528 A1 | 5/2009 | Lindenberg et al. | |
| 2009/0178919 A1 | 7/2009 | Lopp et al. | |
| 2009/0272641 A1 | 11/2009 | Mueller et al. | |

FOREIGN PATENT DOCUMENTS

| | | |
|---|---|---|
| GB | 2049737 | 12/1980 |
| GB | 2155495 | 9/1985 |
| JP | 58-147558 | 9/1983 |
| JP | 63290270 | 11/1988 |
| JP | 63312976 A * | 12/1988 |
| JP | 1283367 | 11/1989 |
| JP | 07224377 | 8/1995 |
| JP | 09-041132 | 2/1997 |
| JP | 09111452 | 4/1997 |
| JP | H10-195644 A | 7/1998 |
| JP | S63-238269 A | 10/1998 |
| JP | 11-106904 | 4/1999 |
| JP | H11-236665 A | 8/1999 |
| JP | 2000265265 | 9/2000 |
| JP | 2002-060935 | 2/2002 |
| JP | 2004-132725 | 4/2004 |
| JP | 2005-314773 A | 11/2005 |
| KR | 100295042 | 4/2001 |
| WO | WO-01/39250 | 5/2001 |
| WO | WO-03062491 | 7/2003 |
| WO | WO-2004-001094 | 12/2003 |
| WO | WO-2004-002979 | 3/2004 |
| WO | WO-2004/033748 | 4/2004 |
| WO | WO-2006/078709 | 7/2006 |
| WO | WO-2007037796 | 4/2007 |
| WO | WO-2008/156794 | 12/2008 |

OTHER PUBLICATIONS

Translation to Mukai (JP 63-312976) published Dec. 1988.*

* cited by examiner

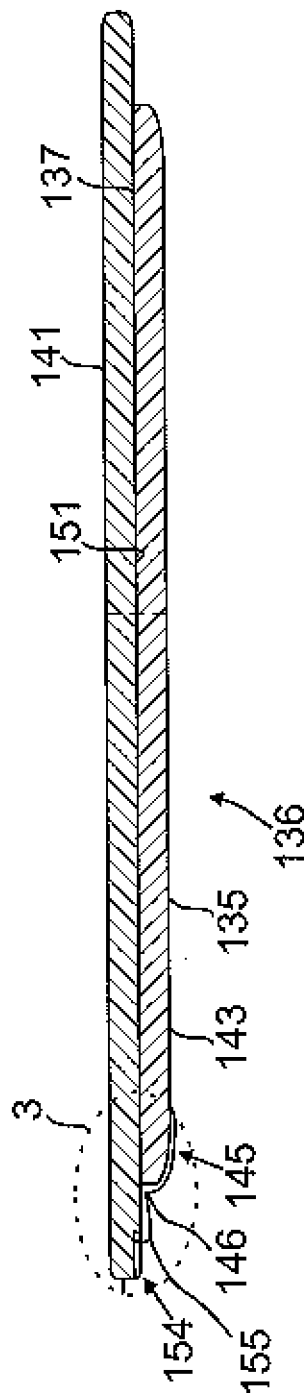
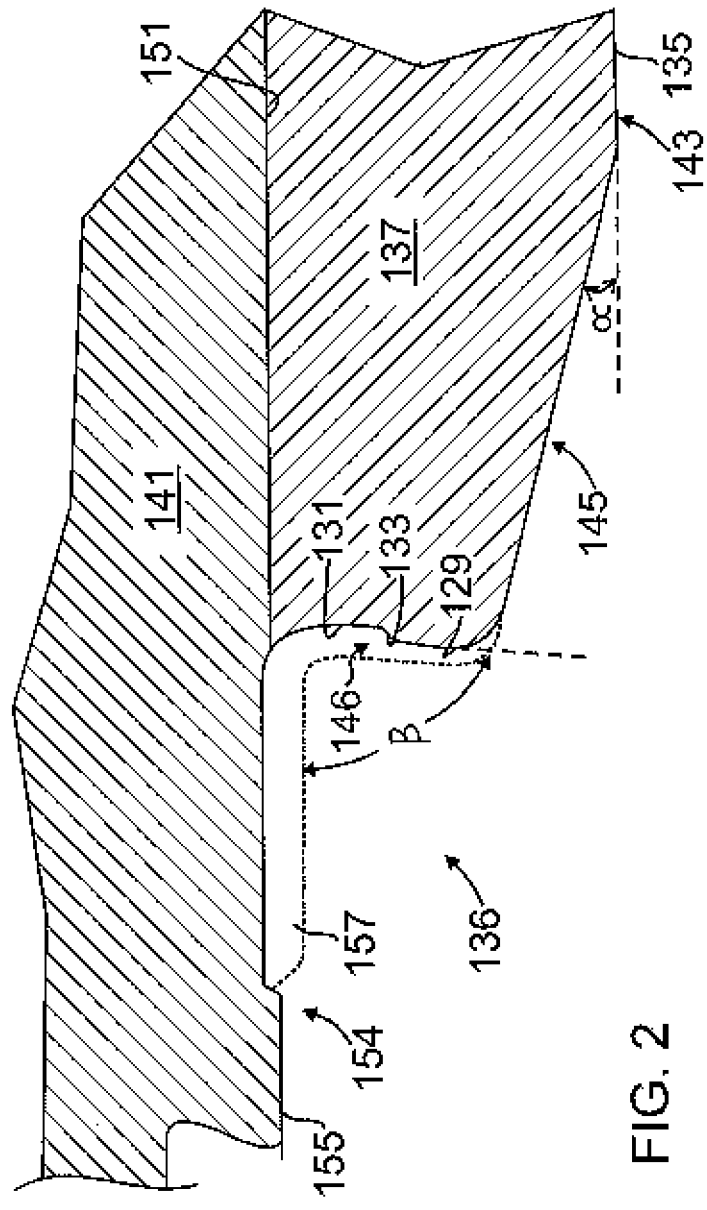

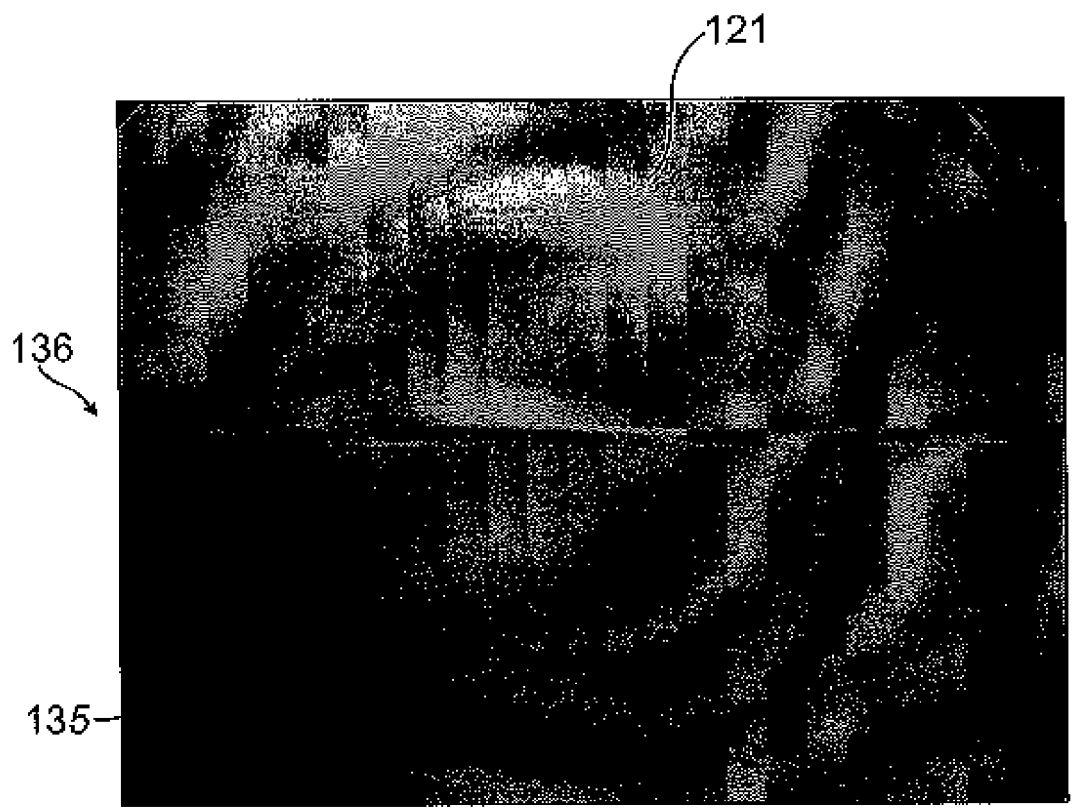
FIG. 3A1
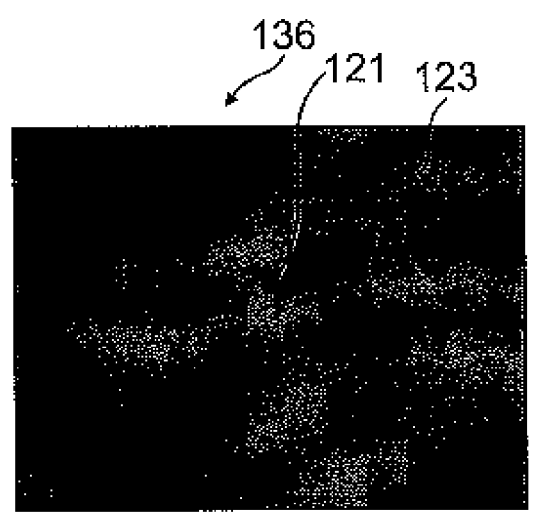
FIG. 3A2
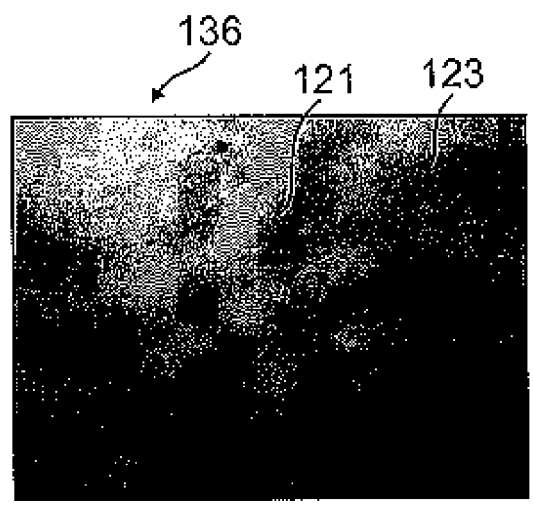
FIG. 3A3

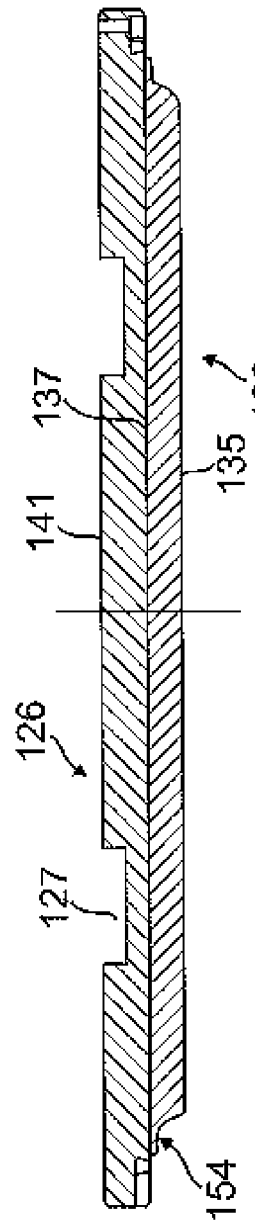
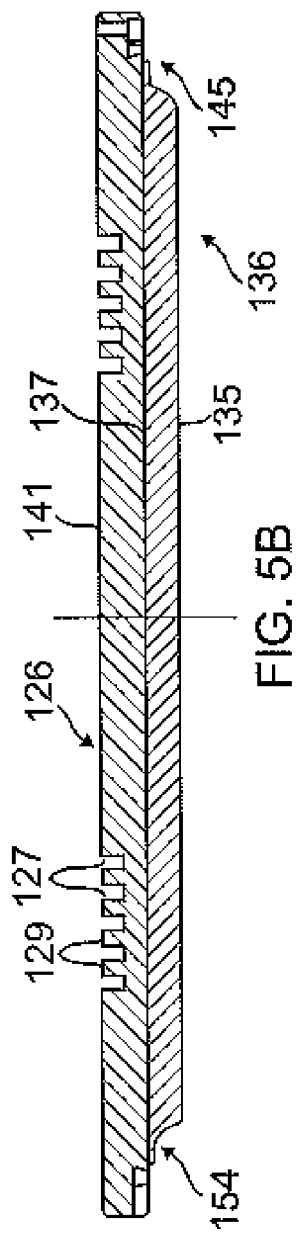
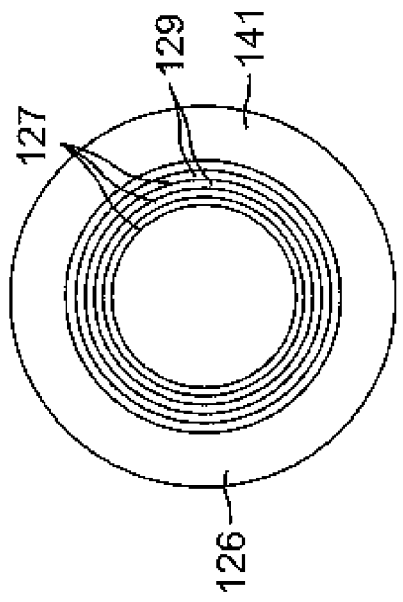
FIG. 5A
FIG. 5B
FIG. 5C

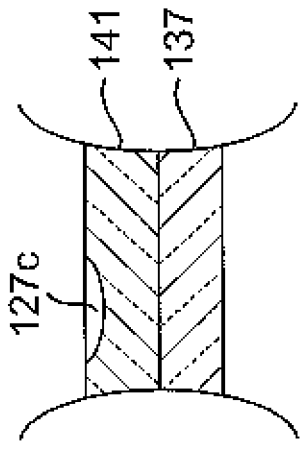
FIG. 6B1
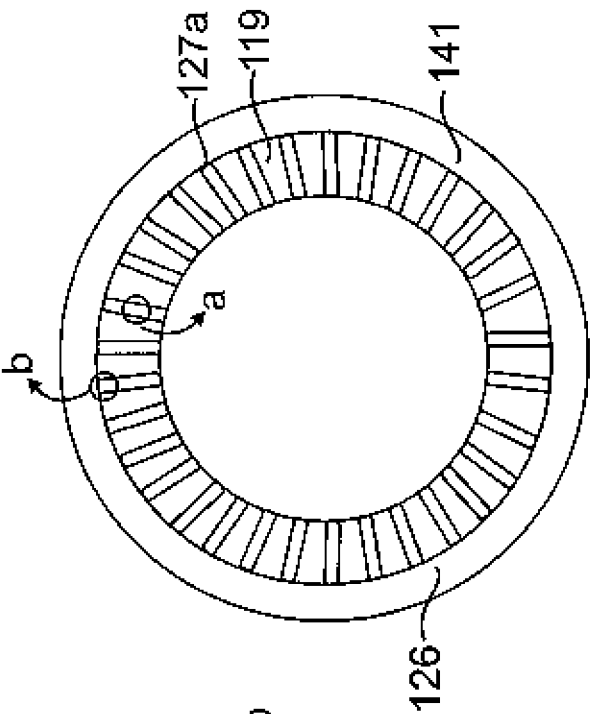
FIG. 6B
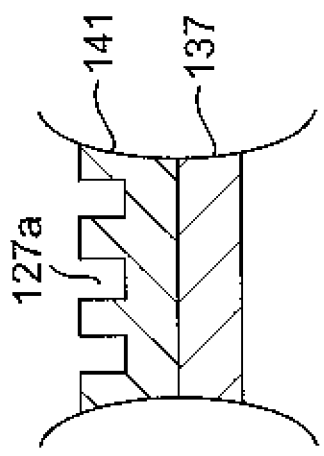
FIG. 6B2
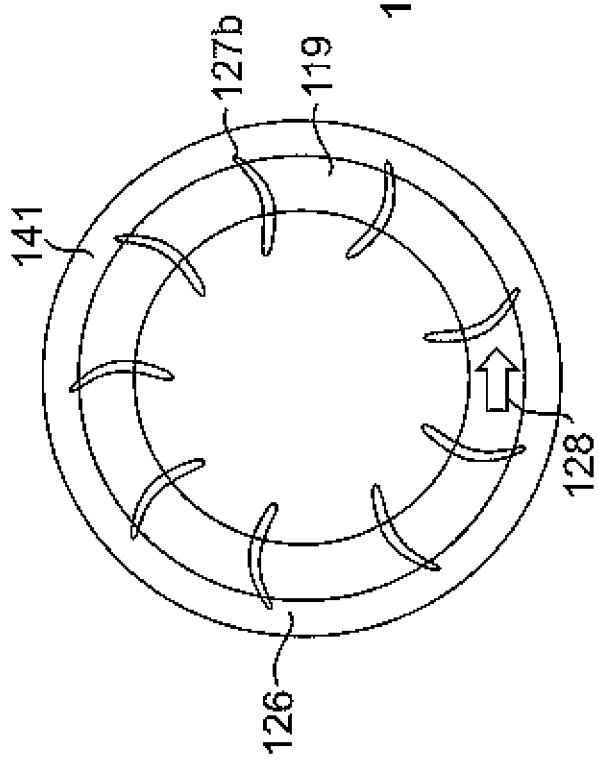
FIG. 6A

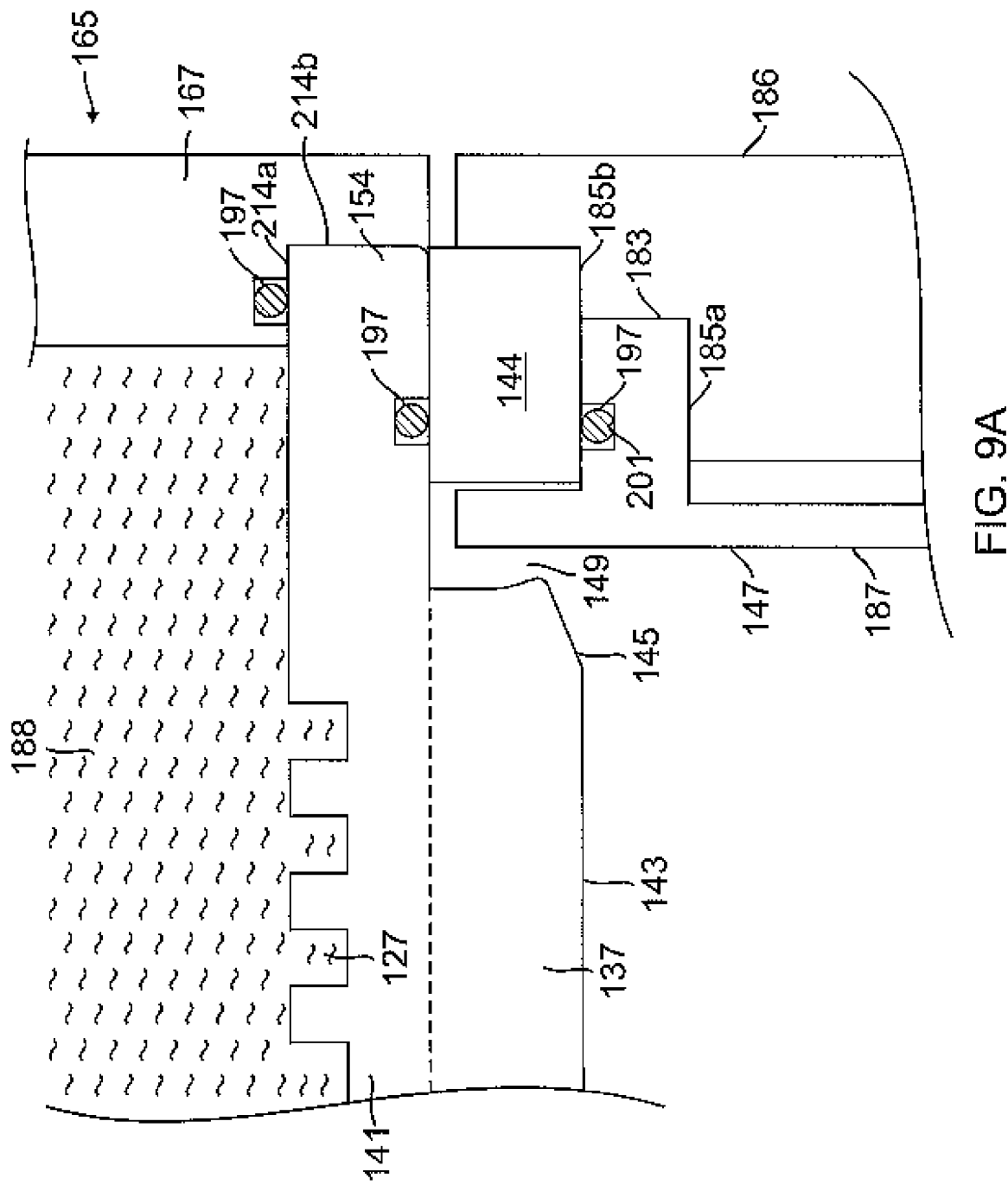

US 8,647,484 B2

TARGET FOR SPUTTERING CHAMBER

CROSS-REFERENCE

The present application claims the benefit of the filing date, under 35 U.S.C. §119(e), of (i) Provisional Application Ser. No. 60/739,658, filed on Nov. 25, 2005, entitled "TARGET AND PROCESS KIT FOR TITANIUM SPUTTERING CHAMBER," and (ii) Provisional Application Ser. No. 60/788,378 filed on Mar. 30, 2006, entitled "TARGET AND PROCESS KIT COMPONENTS FOR SPUTTERING CHAMBER." Both provisional applications are incorporated by reference herein in their entireties.

BACKGROUND

Embodiments of the present invention relate to a target for a sputtering chamber.

In the manufacture of integrated circuits and displays, a substrate such as a semiconductor wafer or display panel, is placed in a process chamber and processing conditions are set in the chamber to deposit material on the substrate or to etch the substrate. A typical chamber comprises an enclosure wall that encloses a plasma zone, a substrate support to support the substrate, a gas supply to provide a process gas in the chamber, a gas energizer to energize gas to process the substrate, and a gas exhaust to maintain a gas pressure. Such chambers can include, for example, sputtering (PVD), chemical vapor deposition (CVD), and etching chambers. In a sputtering chamber, a target is sputtered causing sputtered target material to deposit on a substrate facing the target. In the sputtering process, a process gas comprising inert and/or reactive gas is supplied into the chamber, and the target and substrate are electrically biased relative to one another to form energetic ions which bombard the target causing sputtering material to be knocked off the target and deposited as a film on the substrate. In a magnetron sputtering chamber, a magnetic field generator shapes a magnetic field about the target to improve sputtering of the target.

In these sputtering processes, certain regions of the target are often sputtered at higher sputtering rates than other regions, resulting in uneven sputtering of the target surface. For example, uneven target sputtering can arise from the contoured magnetic field used to confine or stir energized gas ions about the target surface. The contoured magnetic field causes target material to be sputtered off at higher rates at particular regions of the target, which can result in the formation of sputtered grooves in the target after its operation for a number of process cycles. The formation of such grooves in the target is undesirable because they subsequently cause uneven deposition of sputtered material across the substrate. Another problem arises when the sputtering plate of the target debonds from the backing plate due to thermal expansion stresses. The cause of these stresses and debonding was not precisely known.

In sputtering processes, it is undesirable to have material sputtered from the target to accumulate on internal surfaces of the chamber, such as chamber wall and component surfaces, as the accumulated deposits can flake off and contaminate the substrate or cause electrical shorts between the chamber walls and target. Thus, the sputtering chamber also includes a process kit which has components that are arranged about the substrate support and chamber sidewalls to receive the sputtering deposits from the target so that these deposits do not accumulate on the chamber walls and other component surfaces. Periodically, the process kit components are dismantled and removed from the chamber for cleaning. However, the sputtered deposits that accumulate on the process kit components can also flake off between cleaning cycles from the thermal stresses generated in the process cycles. The flaked off deposits in the chamber can contaminate the substrate and so are undesirable. While the chamber can be shutdown for cleaning of kit components at shorter time intervals to solve this problem, the resultant chamber downtime further increases processing costs. Thus, it is desirable to have process kit components which are designed to receive and tolerate ever larger amounts of accumulated deposits without sticking to each other or to the substrate, or resulting in flaking off of accumulated deposits during processing. It would also be desirable if the target were shaped to reduce the formation of sputtering deposits on process kit components.

DRAWINGS

The following description, claims, and accompanying drawings, illustrate exemplary embodiments of different features which can be used by themselves, or in combination with other features, and should not be limited to the exemplary versions shown in the drawings:

FIG. 1 is a sectional side view of a sputtering target that may be used in a sputtering chamber;

FIG. 2 is a view of detail (3) of the sputtering target of FIG. 1;

Figure 4A:
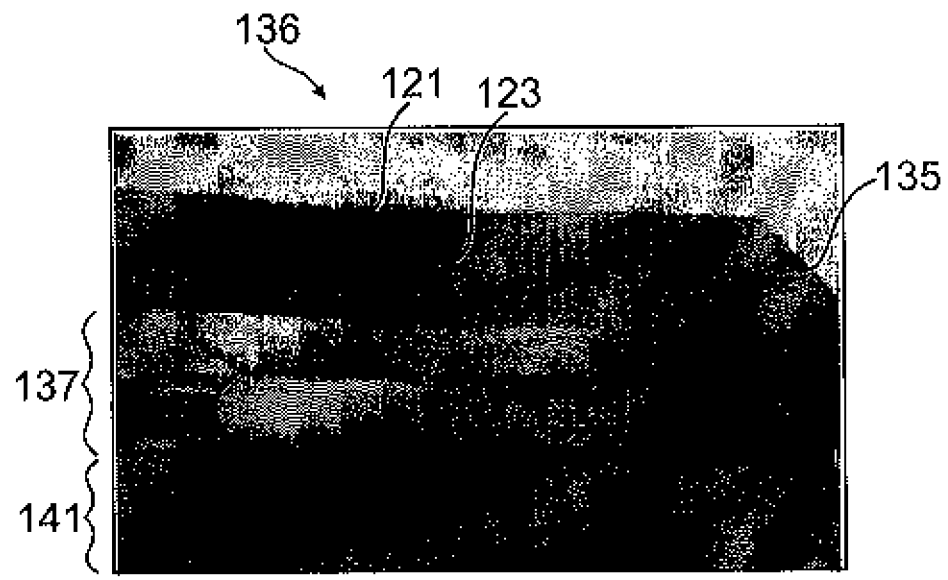
Figure 4B:
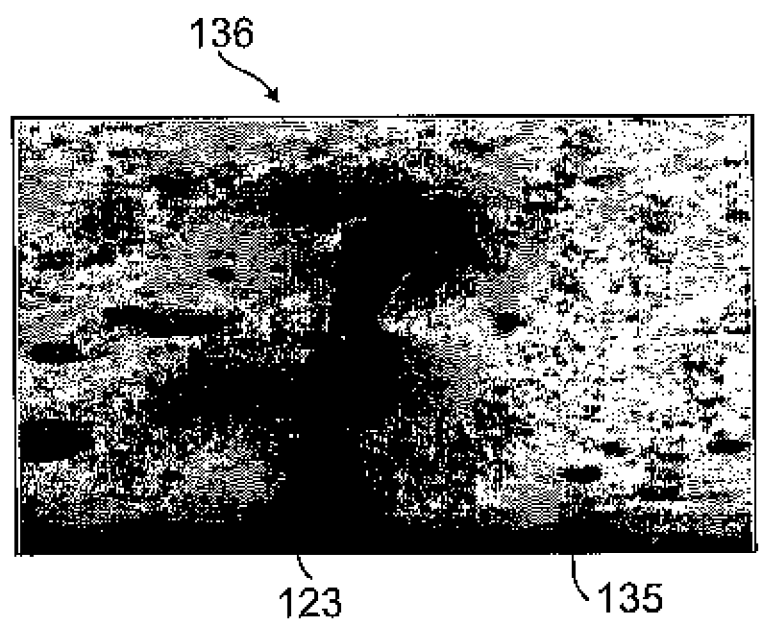
Figure 7:
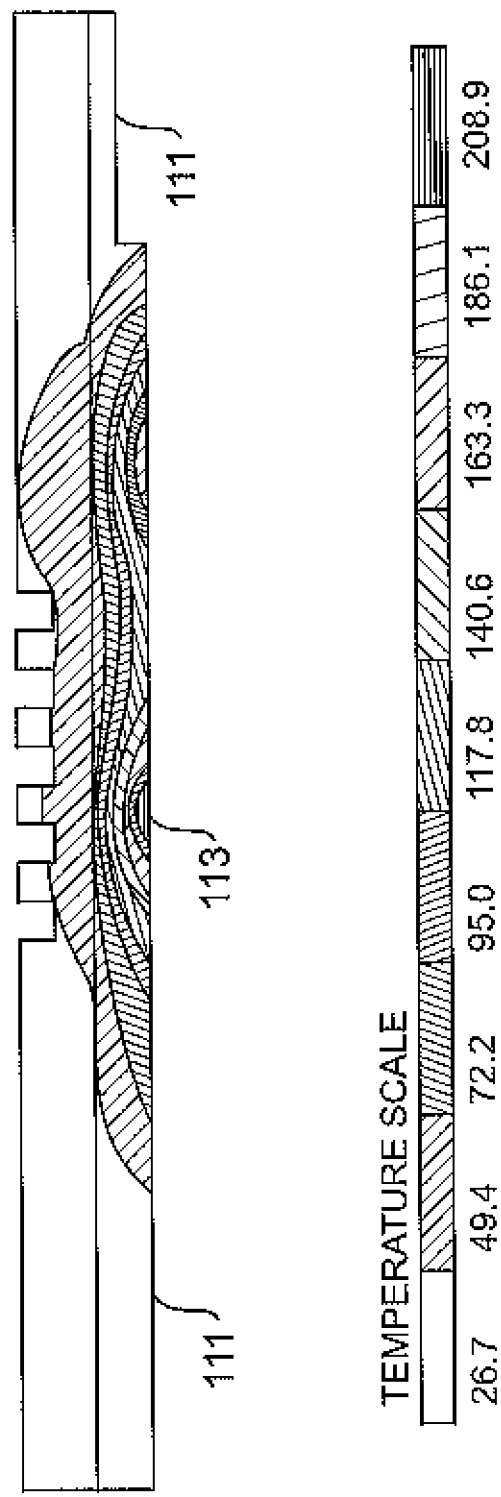
Figure 8:
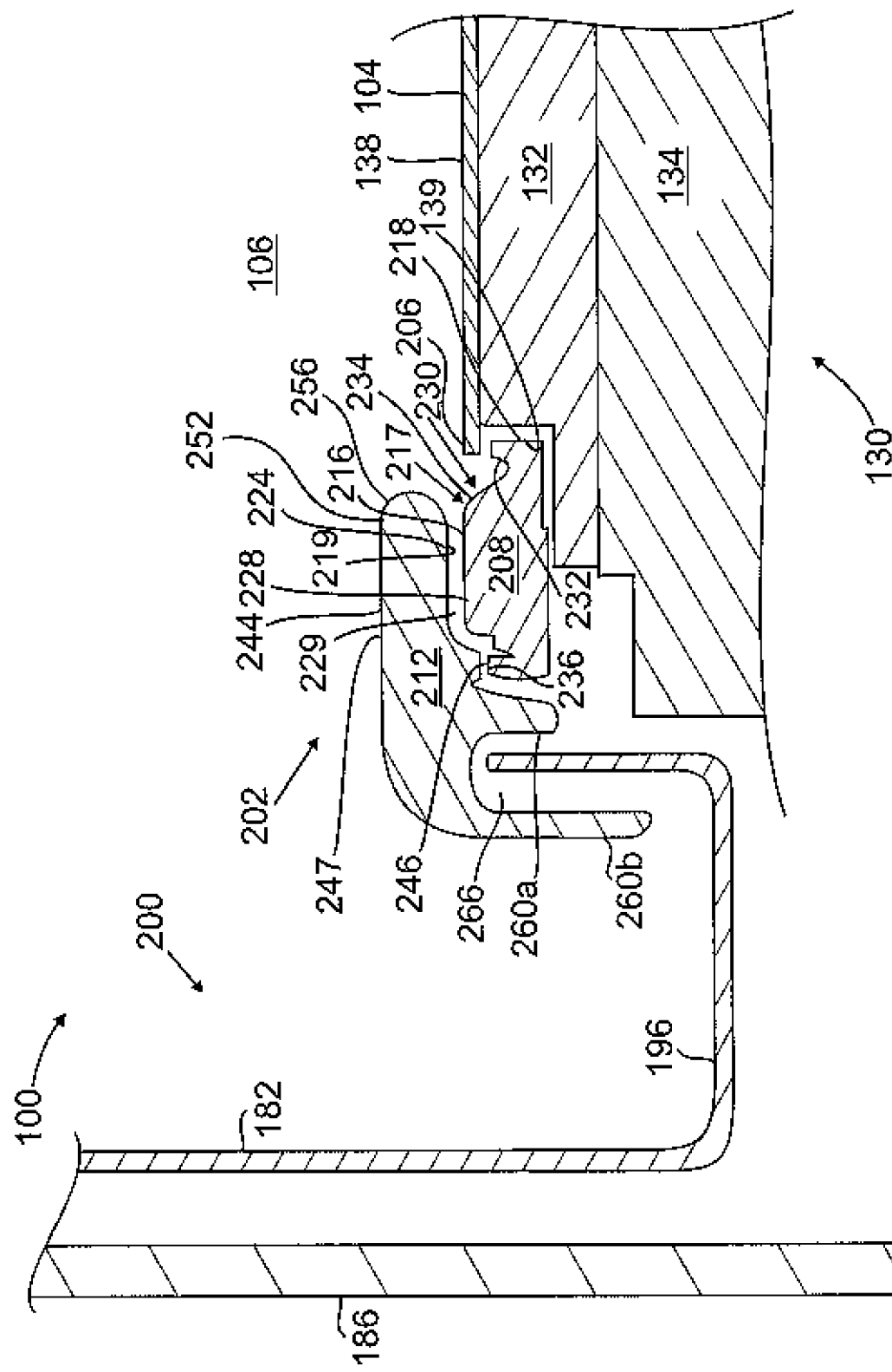
Figure 9:
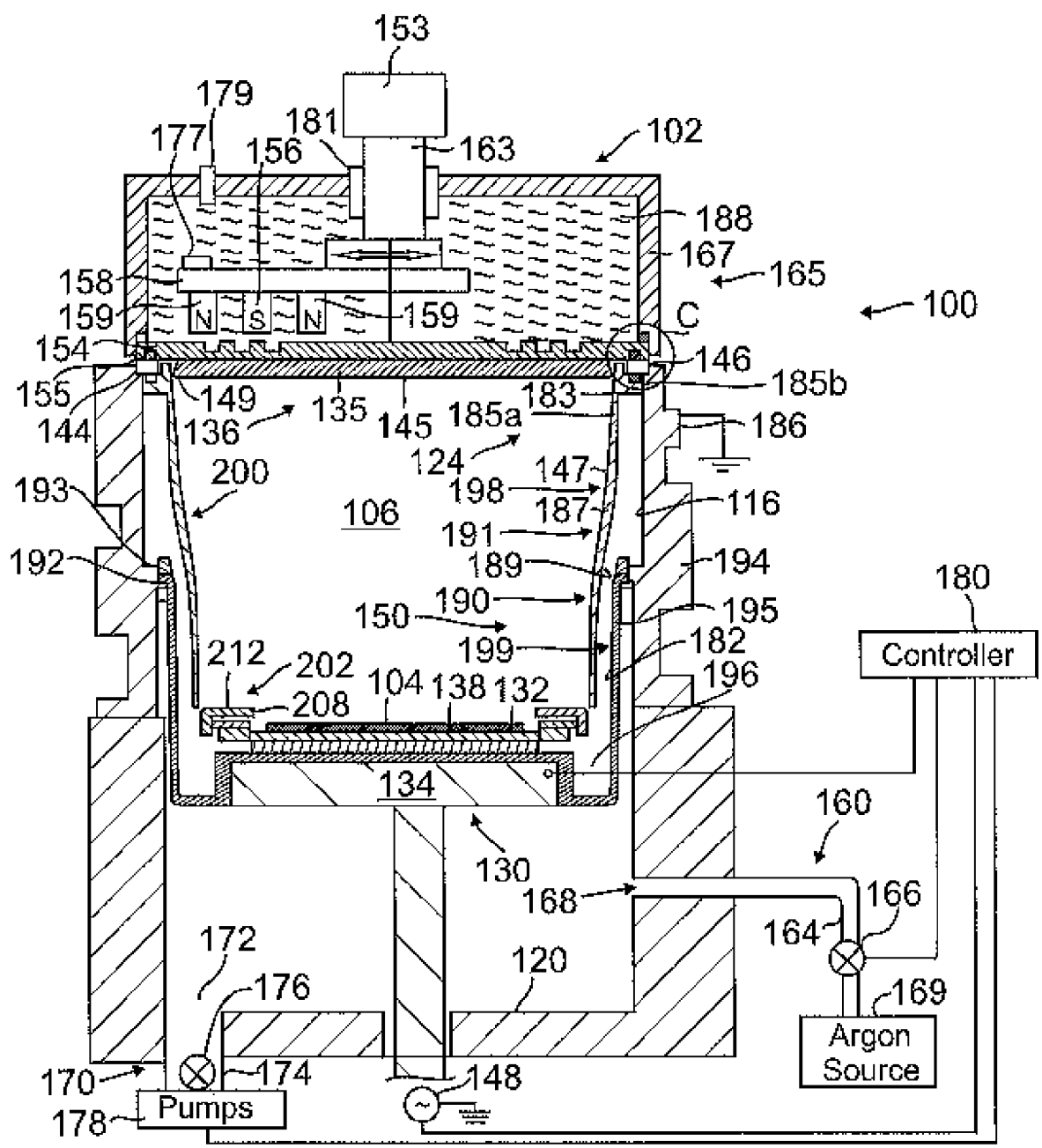

FIGS. 3A1 to 3A3 are photos of the sputtering surface of a sputtering target after exposure to a sputtering plasma for 800 kW hr, showing a circular erosion groove and microcracks;

FIG. 4A is a photo of a side view of a polished sample of a sputtering target after the target has been used in a number of sputter processing cycles showing microcracks that extend downward from the erosion groove on the surface of the target;

FIG. 4B is an SEM photo of a magnified view of a surface microcrack;

FIG. 5A is a sectional side view of an embodiment of a sputtering target having a single groove on its backside surface;

FIG. 5B is a sectional side view of an embodiment of a sputtering target having a plurality of concentric annular grooves on its backside surface;

FIG. 5C is a top view of the backside of another embodiment of a sputtering target having a plurality of concentric annular grooves;

FIG. 6A is a top view of the backside of an embodiment of a sputtering target having a plurality of arcuate radial grooves;

FIG. 6B is a top view of the backside of an embodiment of a sputtering target having a plurality of straight radial grooves;

FIG. 6B1 is a sectional side view of the target of FIG. 6B at detail region "a" showing the rectangular cross-section of the groove;

FIG. 6B2 is a sectional side view of the target of FIG. 6B at detail region "b" showing the curved cross-section of the grooves at their tips;

FIG. 7 is a sectional side view of the cross-sectional temperature profile of a target having a backside surface with a plurality of grooves, as generated by a two dimensional steady state thermal model;

FIG. 8 is a sectional side view of embodiment of a deposition ring, cover ring and lower shield around a substrate support;

FIG. 9 is a schematic sectional side view of a sputtering chamber showing a rotating magnetic assembly, sputtering target, and process kit components; and FIG. 9A is a schematic sectional side view of detail "c" of the sputtering chamber showing the upper shield attached to the source frame and adapter of the chamber.

DESCRIPTION

An exemplary embodiment of a sputtering target 136 that can be used in a sputtering process chamber to deposit sputtered material on a substrate is shown in FIGS. 1 and 2. The sputtering surface 135 of a sputtering plate 137 of the target 136 is positioned facing a substrate 104 during processing in a chamber 100, as shown in the exemplary chamber embodiment of FIG. 9. In one version, the sputtering plate 137 comprises a central cylindrical mesa 143 having the sputtering surface 135 that forms a plane that is parallel to the plane of the substrate 104. An annular inclined rim 145 surrounds the cylindrical mesa 143. In one version, the annular rim 145 is inclined relative to the plane of the cylindrical mesa 143 by an angle α of at least about 8°, for example, from about 10° to about 20°, for example, 15°. A peripheral inclined sidewall 146 having a step 133 surrounds the annular rim 145. The peripheral sidewall 146 is inclined relative to the plane of the cylindrical mesa 143 by an angle β of at least about 60°, for example, from about 75° to about 85°. In one version, the step 133 occurs between a protrusion 129 and recess 131 and the step 133 joins the surfaces 129, 131 at a cutback angle of about 35°. The complex shape of the annular inclined rim 145 and sidewall 146 that is adjacent to an upper shield 147 in a chamber 100, forms a convoluted gap 149 that serves as a labyrinth that impedes the passage of sputtered or plasma species through the gap 149, as shown in FIGS. 9 and 9A.

The sputtering plate 137 comprises a metal or metal compound. For example, the sputtering plate 137 can be a metal, such as for example aluminum, copper, tungsten, titanium, cobalt, nickel or tantalum. The sputtering plate 137 can also be a metal compound, such as for example, tantalum nitride, tungsten nitride or titanium nitride. In one version, the sputtering plate 137 comprises titanium at a high purity level, for example, at least about 99.9%, or even at least about 99.99%.

The sputtering plate 137 is mounted on a backing plate 141 which has a support surface 151 to support the sputtering plate 137 and a peripheral ledge 154 that extends beyond the radius of the sputtering plate 137. The peripheral ledge 154 comprises an outer footing 155 that rests on an isolator 144 in the chamber 100 (FIG. 9). The isolator 144 electrically isolates and separates the backing plate 141 from the chamber 100, and is typically a ring made from a ceramic material, such as aluminum oxide. The peripheral ledge 154 is shaped to inhibit the flow or migration of sputtered material and plasma species through the gap 149 between the target 136 and the isolator 144, to impede the penetration of low-angle sputtered deposits into the gap 149.

In one version, the backing plate 141 is made from a metal, such as stainless steel or aluminum. In another version, the backing plate 141 comprises copper-zinc, which comprises, for example, copper in an amount of from about 59 to about 62 wt % and zinc in an amount of from about 38% to about 41%. Copper-zinc is diamagnetic and its resistivity does not change with temperature. Copper-zinc has a thermal conductivity of about 130 w/mK and an electrical resistivity of about 6.8 μohm cm. In one embodiment, the sputtering plate 137 is mounted on the backing plate 141 by diffusion bonding by placing the two plates 137, 141 on each other and heating the plates to a suitable temperature, typically at least about 200° C.

In yet another version of the target 136, it was determined that groove erosion and microcracks in a target 136 can be reduced by making the backing plate 141 of the target out of a material that has a high thermal conductivity and/or a low electrical resistivity. When the sputtering chamber 100 has a magnetic field generator 102 (as shown in the exemplary embodiment of a chamber of FIG. 9), the rotating moving magnetic field was determined to cause formation of an erosion groove 121 and microcracks 123 that extend downward from the erosion groove 121, as shown in FIGS. 3A1 to 3A3. FIG. 3A1 shows a circular erosion groove 121 that occurs on the sputtering surface 135 of a sputtering target exposed to a plasma of 800 kW hr, during the processing of a batch of 3000 substrates, and FIGS. 3A2 and 3A3 show more detail of the erosion grooves 121 and the microcracks 123. FIG. 4A is a photo of a polished sample of a target 136 having a plurality of microcracks 123 that extended downward from the erosion groove 121 on the surface of the target. FIG. 4B shows a magnified SEM photo of one of the microcracks 123 that is about 4181 microns deep. The microcracks 123 and erosion groove 121 can result in poor sputtering properties and non-uniform sputtering from these regions of the target 135 after the processing of a number of substrates. As a result, the target has to be more frequently replaced, for example, after processing only a small number of substrates 104, which is undesirable.

In one method, the erosion groove problem is reduced by using a backing plate 141 made from a material having a thermal conductivity that is sufficiently high to dissipate the heat generated in the target 136 which is formed in both the sputtering plate 137 and the backing plate 141. The heat is generated from the eddy currents that arise in these plates and also from the bombardment of energetic ions from the plasma onto the sputtering surface 135 of the target 136. The higher thermal conductivity backing plate allows dissipation of the heat generated in the target 136 to the surrounding structures or even to a heat exchanger which may be mounted behind the backing plate 141 or may be in the backing plate 141 itself. For example, the backing plate 141 can comprise channels (not shown) to circulate a heat transfer fluid therein. It has been determined that a suitably high thermal conductivity of the backing plate 141 is at least about 200 W/mK, for example, from about 220 to about 400 W/mK. Such a thermal conductivity level allows the target to be operated for longer process time periods by dissipating the heat generated in the target more efficiently.

The backing plate 141 can also be designed to have an electrical resistivity that is in a desirable range which has been found to reduce erosion groove occurrences while still allowing operation of the target 136 for an extended time period. The electrical resistivity should be sufficiently low to allow the target to be electrically biased or charged during sputtering. However, the electrical resistivity should also be sufficiently high to reduce the effect of eddy currents in the target 136, as the heat generated by the eddy current as it travels along a pathway through the target 136 is proportional to the electrical resistance encountered along the pathway. In one version, it has been determined that the electrical resistivity of the backing plate 141 should be from about 2 to about 5 μohm cm, or even from about 2.2 to about 4.1 μohm cm.

An example of a backing plate 141 made from a metal alloy that has the desired thermal conductivity and electrical resistivity is a backing plate 141 comprising, for example, copper-chrome. Copper-chrome is a paramagnetic material having an electrical resistivity that varies with temperature. Such a change is undesirable because it changes material properties and resultant sputtering characteristics. However, the resistivity of copper-chrome does not change until its temperatures exceed 600° C., which is sufficiently high to exceed normal sputtering process temperatures. C-180000 temperature is greater than 400° C. In one version, the copper-chrome alloy comprises a ratio of copper to chrome of from about 80:1 to about 165:1. The copper-chrome alloy comprises copper in a wt % of from about 98.5 to about 99.1 wt %, and chrome in a wt % of from about 0.6 to about 1.2 wt %. The copper-chrome alloy has a thermal conductivity of about 340 W/mK and an electrical resistivity of about 2.2 µohm cm. In one version, the copper-chrome alloy comprises C-18000 or C-18200. C18000 alloy has a thermal conductivity of about 225 W/mK and an electrical resistivity of about 4.1 µohm cm.

In another version, which can be used in combination with a backing plate 141 made of a material having a high thermal conductivity and low resistivity, or separately and by itself, the backing plate 141 comprises a backside surface 126 having one or more grooves 127. For example, one version of a backing plate 141 with a groove 127 that is an annular groove is shown in FIG. 5A. In this version, the groove 127 is located with a radius that extends from about 0.3 R to about 0.8 R, where R is the radius of the backing plate 141. It has been determined that at this range of radia, the groove 127 provides efficient cooling at a critical annular region which corresponds to the backside 141 of the target 136 which directly opposes the region that corresponds to the annular erosion groove 121. For a backing plate 141 sized about radius 250 mm, a suitable groove 127 is sized with a central radius of from about 75 to about 200 mm. The groove 127 comprises a $\Delta r$, which is the distance between the outer and inner radius of the groove 127, of about from about 2 to about 10 mm, for example, about 6 mm. In one version, the distance from the outer radius of the groove 127 to the circumference of the backing plate 141 is from about 50 to about 100 mm.

In another version, the backing plate 141 comprises a backside surface 126 with a plurality of grooves 127 that are spaced apart from one another, a version of which is shown in FIG. 5B. In one version, the grooves 127 are concentric, annular, and spaced apart from one another and separated by ridges 129 that function cooperatively to dissipate heat better from the backside surface 141 causing the whole target 136 to operate at cooler temperatures during sputter processing. In one version, the backside surface 126 has at least 4 grooves, for example, from about 3 to about 20 grooves, and in one version, 9 grooves. Each groove 127 comprises a $\alpha r$ (distance between the outer radius of a particular groove 127 and its inner radius) of from about 2 to about 10 mm, for example, about 6 mm. The ridges 129 have a width of about from about 2 to about 10 mm, for example, about 6 mm. FIG. 5B shows a backside surface having five grooves 129 which are concentric and annular with four intervening ridges 127. FIG. 5C shows a top view of a backside surface 126 of an embodiment of a sputtering target 136 having three concentric annular grooves 127 with two ridges 129 therebetween.

The grooves 127 and ridges 129 can also have other patterns, for example, rectangular grid pattern, chicken feet patterns, or simply straight lines running across the backside surface 126. FIG. 6A is a top view of the backside of an embodiment of a sputtering target having a plurality of grooves 127 that are curved radial grooves 127a that extend primarily along the radial direction. In the version of FIG. 6A, the grooves 127 are curved to be convex shaped relative to the direction of the rotating magnets in the chamber as shown by the arrow 128. In the version of FIG. 6B, the grooves 127 are straight radial grooves 127b and they are directed straight along the radial direction. The straight radial grooves 127b meet at the center of the backside surface 126. FIG. 6B1 is a sectional side view of the target of FIG. 6B showing the general rectangular cross-section of the groove 127. However, the tip 127c of the grooves have a curved cross-section which tapers off as it reaches the surface 126, as shown in FIG. 6B2. The area between the plurality of grooves 127 in FIGS. 6A and 6B is the erosion area 119.

The unexpected results obtained from different embodiments of targets 136 were demonstrated by modeling and experimental results. Table I shows the results of a simulation modeling study conducted on titanium targets 136 with different thicknesses, having backing plates 141 made from different materials and with or without grooves, to determine their simulated steady state target temperature, deflection and stress. A finite element analysis modeling program was used to determine two-dimensional study state thermal stress modeling for a target in simulated sputtering process conditions, the modeling program being ANSYS 10.0. The variables being tested by computer simulation include: (1) the thickness of the target; (2) the material used for the backing plate; and (3) the specific design of the backing plate. Three target thickness values were tested, including 12.7 mm (0.5 inches), 8.89 mm (0.35 inches) and 6.35 mm (0.25 inches). The two types of backing plate 141 tested were copper-zinc and copper-chrome plates. The backing plate 141 either had a flat surface, a single annular groove, or multiple grooves. These variables produced different resultant maximum target temperatures, maximum target deflection values, and maximum thermal stress values.

TABLE I

| EXAMPLE NO. | TITANIUM TARGET THICKNESS (in) | BACKING PLATE MATERIAL | BACKING PLATE BACKSIDE SURFACE | MAXIMUM TARGET TEMPERATURE (° C.) | MAXIMUM TARGET DEFLECTION (mm) | MAXIMUM STRESS (MPa) |
|---|---|---|---|---|---|---|
| 1 | 12.181 mm (0.5) | Cu/Zn | Flat | 360 | 0.88 | 97 |
| 2 | 12.181 mm (0.5) | Cu/Cr | Flat | 323 | 0.783 | 91 |
| 3 | 6.35 mm (0.25) | Cu/Zn | Flat | 242 | ? | ? |
| 4 | 8.89 mm (0.35) | Cu/Zn | Flat | 289 | 0.785 | 93 |
| 5 | 8.89 mm (0.35) | Cu/Zn | Single Groove | 269 | 1.1 | 76 |
| 6 | 8.89 mm (0.35) | Cu/Cr | Flat | 253 | 0.639 | 85 |
| 7 | 8.89 mm (0.35) | Cu/Cr | Single Groove | 247 | 1.073 | 70 |

TABLE I-continued

| EXAMPLE NO. | TITANIUM TARGET THICKNESS (in) | BACKING PLATE MATERIAL | BACKING PLATE BACKSIDE SURFACE | MAXIMUM TARGET TEMPERATURE (° C.) | MAXIMUM TARGET DEFLECTION (mm) | MAXIMUM STRESS (MPa) |
|---|---|---|---|---|---|---|
| 8 | 8.89 mm (0.35) (eroded) | Cu/Zn | Flat | 261 | 0.738 | 107 |
| 9 | 8.89 mm (0.35) | Cu/Cr | Multiple Grooves | 232 | 0.928 | 77 |

It was determined that the properties of the backing plate 141 considerably changed the steady state temperature reached by the target 136 during a simulated sputtering process. For example, as shown in Table I, Example 1 which used a target 136 having a thickness of 12.7 mm and a backing plate 141 made from a copper-zinc alloy with a flat backside surface, provided a target temperature of 360° C., a deflection of 0.88 mm, and a thermal stress of 97 MPa. In contrast, Example 9 which used a backing plate 141 made from a copper-chrome alloy with a target 136 thickness of 8.9 mm and had a backside surface 126 having a plurality of grooves 129, provided the lowest target temperature of 232° C., a deflection of 0.93 mm, and a thermal stress of 77 MPa. Thus, the lowest target temperature of 232° C. was obtained by Example No. 9, which had a target thickness of 8.89 mm (0.35 inches) that was thinner than the plate of Example 1, was made of the more thermally conductive copper-chrome, and had a backside surface 126 with a plurality of grooves 129.

From these results it was determined that a backing plate 141 comprising copper-chrome instead of copper-zinc, with all other variables being equal, had a much lower simulated operational target temperature. The maximum target temperature was also lower for the backing plate having a backside surface with a single groove as opposed to a flat surface. A backing plate 141 having multiple grooves 129 as in Example 9, also resulted in lower target temperatures than a backing plate 141 having a single groove as in Example No. 7. Thus, one desirable version of a target 136 had a thickness of 8.9 mm (0.35 inches) and gave a surprisingly low target temperature, with acceptable levels of deflection and stress, had a backing plate 141 made of copper-chrome and had multiple grooves 129. FIG. 7 shows the cross-sectional temperature profile of a desirable target 136 having a backing plate 141 made from copper-chrome, and with a backside surface 126 with a plurality of grooves 129, as generated by the same two dimensional steady-state thermal model. The hottest area 113 occurs on the backside surface 126 of the backing plate 141, underneath the plurality of grooves 129. The coolest area 111 occurs in the areas furthest away from the plurality of groves 129.

Table II presents actual sputtering process data from targets 136 having the backing plates 141 made from copper-zinc or copper-chrome, a titanium target with one of four different thicknesses, and with the backside surfaces 126 of the targets 136 that are either flat, with a single groove 129, or with multiple grooves 129. The total sputtering process time for sputter deposition on any single substrate of a batch of substrates processed in the chamber was set so that the target 136 would not reach temperatures sufficiently high to produce an erosion groove and microcracks in the target 136. Accordingly, in Examples 1 and 2, which were to targets 136 comprising a backing plate 141 made from copper-zinc, and with a flat surface or a single groove 129, the plasma sputtering time per substrate was limited to 20 and 30 seconds, respectively. This provided a deposition thickness of 160 angstroms for Example 1 and 240 angstroms for Example 2. In contrast, a target 136 comprising a backing plate 141 made from copper-chrome and with a plurality of grooves 129, as in Examples 3 and 4, allowed a higher total sputtering plasma process time per substrate of greater than 40 seconds without risk of forming an erosion groove 121 in the target 136. This is because the targets of Examples 3 and 4 provided a lower steady-state temperature during sputtering operation than the targets of Examples 1 and 2. As a result, Examples 3 and 4 provided much higher deposition levels of 320 angstroms, corresponding to about 1.5 to 2 times higher than the total deposition thickness per substrate provided by the targets of Examples 1 and 2.

In yet another version, the peripheral ledge 154 of the target 136 is coated with a protective coating, for example, a twin-wire arc sprayed aluminum coating 157 as shown in FIG. 1. Before coating, the peripheral ledge 154 is degreased and ground with a silicon carbide disc to achieve a roughness of 200 to 300 microinches. The coating 157 extends to cover the peripheral sidewall 146 of the sputtering plate 137 and the peripheral ledge 154 of the backing plate 141. The coating 151 has a final surface roughness of 700±200 microinches, and a thickness of from about 5 to about 10 mils. The coating 157 protects the edges of the target 136 provides better adhesion of the sputtered material and reduces flaking of the material from these surfaces.

TABLE II

| BACKING PLATE MATERIAL | THERMAL CONDUCTIVITY ($W \cdot m^{-1} \cdot K^{-1}$) | Ti THICK (in) | BACKING PLATE BACKSIDE SURFACE | DEPOSITION TIME (sec) | SPUTTERED DEPOSITION THICKNESS (A) |
|---|---|---|---|---|---|
| CuZn | 130 | 0.50 | Flat | 20 | 160A |
| CuZn | 130 | 0.35 | Single Groove | 30 | 240A |
| CuCr | 340 | 0.45 | Multiple Grooves | >40 | >320A |
| CuCr | 340 | 0.45 | Multiple Grooves | >40 | >320A |

A process kit 200 for a sputtering chamber 100 comprising various components that can be removed from the chamber 100, for example, to clean sputtering deposits off the component surfaces, replace or repair eroded components, or to adapt the chamber for different processes. In one version, the process kit 200 comprises a ring assembly 202 for placement about a peripheral wall 139 of the substrate support 130 that terminates before an overhanging edge 206 of the substrate, as shown in FIG. 8. The ring assembly 202 comprises a deposition ring 208 and a cover ring 212 that cooperate with one another to reduce formation of sputter deposits on the peripheral walls 139 of the support 130 or the overhanging edge 206 of the substrate 104.

The deposition ring 208 can be easily removed to clean sputtering deposits from the exposed surfaces of the ring so that the support 130 does not have to be dismantled to be cleaned. The deposition ring 208 protects the exposed side surfaces of the support 130 to reduce their erosion by the energized plasma species. In the version shown in FIG. 8, the deposition ring 208 comprises an annular band 216 that extends about and surrounds the peripheral wall 139 of the support 130. The annular band 216 comprises an inner lip 218 which extends transversely from the band and is substantially parallel to the peripheral wall 139 of the support 130. The inner lip 218 terminates immediately below the overhanging edge 206 of the substrate 104. The inner lip 218 defines an inner perimeter of the deposition ring 208 which surrounds the periphery of the substrate 104 and support 130 to protect regions of the support 130 that are not covered by the substrate 104 during processing. For example, the inner lip 218 surrounds and at least partially covers the peripheral wall 139 of the support 130 that would otherwise be exposed to the processing environment to reduce or even entirely preclude deposition of sputtering deposits on the peripheral wall 139.

The annular band 216 of the deposition ring 208 also has a raised ridge 224 that extends along the central portion of the band 216. The raised ridge 224 has a flat top surface 228 that is substantially parallel to the plane of the receiving surface 138 of the substrate support 130, and spaced apart from the cover ring 212 to form a narrow gap 229 therebetween. The narrow gap acts as a labyrinth to reduce penetration of plasma species into the gap or the regions at the end of the gap. An open inner channel 230 lies between the inner lip 218 and the raised ridge 224. The open inner channel 230 extends radially inward to terminate at least partially below the overhanging edge 206 of the substrate 104. The inner channel 230 has a first rounded corner 232 joining to the inner lip 218 and a gently sloped surface 234 joining to the raised ridge 224. The smooth corner 232 and sloped surface 234 facilitate the removal of sputtering deposits from these portions during cleaning of the deposition ring 208. The deposition ring 208 also has a ledge 236 which extends radially outward of the raised ridge 224, and serves to support the cover ring 212. Unlike prior art designs, pins are not needed in the deposition ring 208 to retain the substrate 104 in the event that the substrate 104 slides or is misplaced in the chamber 100, due to accurate positioning of the substrate in the chamber during its transportation into the chamber.

In one version, the deposition ring 208 is made by shaping and machining a ceramic material, such as aluminum oxide. Preferably, the aluminum oxide has a purity of at least about 99.5%, to reduce contamination of the chamber by undesirable elements such as iron. The ceramic material is molded and sintered using conventional techniques such as isostatic pressing, followed by machining of the molded sintered preformed using suitable machining methods to achieve the shape and dimensions required.

In one preferred version, the annular band 216 of the deposition ring 208 comprises an exposed surface 217 that is bead blasted to achieve a predefined level of surface roughness while adjacent surfaces are masked off to prevent accidental bead blasting of these surfaces. In the bead blasting process, aluminum oxide grit is blasted through a nozzle of a grit blaster (not shown) toward the exposed surface of the deposition ring. The grit blaster can be a pressure driven grit blaster which is powered using compressed gas at a pressure of from about 20 to about 45 psi. Alternatively, a siphon driven grit blaster can be used at an operating pressure of from about 60 to about 80 psi. The nozzle of the grit blaster is maintained at an angle of about 45° relative to the plane of the exposed surface, and at a distance of about four to 6 inches. Grit blasting is performed with a grit size suitable to achieve the predefined surface roughness. The grit blasted surface roughness average of 150±50 microinches provides a suitable surface for strong adhesion of sputtered titanium deposits.

The surface roughness average is the mean of the absolute values of the displacements from the mean line of the peaks and valleys of the roughness features along the exposed surface. The roughness average, skewness, or other properties may be determined by a profilometer that passes a needle over the exposed surface 217 and generates a trace of the fluctuations of the height of the asperities on the surface, or by a scanning electron microscope that uses an electron beam reflected from the surface to generate an image of the surface. To measure the surface roughness average, the exposed surface of a test deposition ring 208 can be cut into coupons and one or more measurements are made on each coupon. These measurements are then averaged to determine an average surface roughness of the exposed surface 217. In one embodiment, three coupons are used and four traces of the changes in the heights of the peaks and valleys of the features of the surface roughness are made on each coupon.

The cover ring 212 of the ring assembly 202 comprises an undersurface 219 that is spaced apart from, overlies, and at least partially covers the raised ridge 224 of the deposition ring 208 to define the narrow gap 229 which impedes travel of plasma species through the gap. The constricted flow path of the narrow gap 229 restricts the build-up of low-energy sputter deposits on the mating surfaces of the deposition ring 208 and cover ring 212, which would otherwise cause them to stick to one another or to the peripheral overhang edge 206 of the substrate 104.

The cover ring 212 comprises an annular plate 244 which has a footing 246 which rests on a surface about the substrate support 130, such as on the ledge 236 of the deposition ring 208. The footing 246 extends downwardly from the plate 244 to press against the ledge 236 on the deposition ring 208. The annular plate 244 serves as a boundary to contain the sputtering plasma within the process zone between the target 136 and the support 130, receives the bulk of the sputtering deposits, and shadows the deposition ring 208. The annular plate terminates in a projecting brim 256 which overlies the raised ridge 224 of the deposition ring 208. The projecting brim 256 terminates in a rounded edge 258 and has a planar bottom surface 260 which is the undersurface of the cover ring. The projecting brim 256 inhibits the deposition of sputtering deposits on the overhang edge 206 of the substrate and also reduces deposits on the peripheral walls 139 of the support 130.

The cover ring 212 also has a pair of cylindrical walls 260a,b that extend downwardly from the annular plate 244. The cylindrical walls 260a,b are located radially outward of the footing 246 of the wedge 244. The inner cylindrical wall 260a has a smaller length than the outer wall 260b. For example, the inner wall 260a can have a first length that is shorter than a second length of the outer wall 260b second leg by at least about 10%. The walls 260a, 260b are spaced apart to form yet another convoluted pathway 265 which impedes travel of plasma species and glow discharges to the surrounding area. In one version, the inner wall 260a has a length of about 0.7 inches.

The cover ring 212 is fabricated from a material that can resist erosion by the sputtering plasma, for example, a metallic material such as stainless steel, titanium or aluminum; or a ceramic material, such as aluminum oxide. In one version, the cover ring 212 is made from stainless steel and has an exposed surface 247 that is substantially parallel to the receiving surface 138 of the substrate support 130. The exposed surface 247 is bead blasted to obtain a surface roughness of 175±75 microinches. The bead blasted surface is prepared in the same manner as the bead blasting process for the exposed surface 217 of the deposition ring 208 as described above with suitable modifications to the grit size to achieve the desired roughness values.

The process kit 200 can also includes a shield assembly 150 that encircles the sputtering surface of a sputtering target 136 and the peripheral edge 139 of the substrate support 130, as shown in FIG. 1, to reduce deposition of sputtering deposits on the sidewalls 116 of the chamber 100 and the lower portions of the support 130. The shield assembly 150 reduces deposition of sputtering material on the surfaces of support 130, and sidewalls 116 and bottom wall 120 of the chamber 100, by shadowing these surfaces.

In one version, as shown in FIG. 9, the shield assembly 150 comprises an upper shield 147 and a lower shield 182 that cooperate together to shadow the wall surfaces and lower portion of the chamber 100. As shown in FIG. 9A, the upper shield 147 comprises a support lip 183 which rests on a first ledge 185a of an upper adapter 186 in the chamber. The upper adapter 186 can serve as the sidewall of the chamber 100. Referring to FIG. 9A, the support lip 183 contains an O-ring groove 201 into which an O-ring 197 is placed to form a vacuum seal. An isolator 144 rests above the support lip 183 and further extends onto a second ledge 185b of the upper adapter 186. The peripheral ledge 154 of backing plate 141 rests on top of isolator 144. The peripheral ledge 154 contains an O-ring groove 201 into which an O-ring 197 is placed to form a vacuum seal. Source frame 167 abuts peripheral ledge 154 on a top surface 214a and a side surface 214b of peripheral ledge 154. Source frame 167 contains an O-ring groove 201 into which an O-ring 197 is placed to form a vacuum seal. The O-ring groove 201 in source frame 167 is located above top surface 214a of peripheral ledge 154. The upper shield 147 also has an annular band 187 with a first cylindrical surface 189 having a first diameter sized to encircle the sputtering plate of the sputtering target, a second cylindrical surface 190 with a second diameter sized smaller than the first diameter, and a sloped surface 191 between the first and second surfaces 189, 190.

The lower shield 182 also has a support ledge 192 which rests on a circumferential lip 193 of the lower adapter 194 to support the lower shield 182. The lower shield 182 comprises a cylindrical outer band 195 that extends below the second cylindrical surface 190 of the upper shield 147, a base plate 196 that extends radially inward from the bottom end of the cylindrical outer band 195, and a cylindrical inner band 196 joined to the base plate 195 which at least partially surrounds the substrate support 130, as shown in FIG. 8. The inner band 196 comprises a height that is smaller than the outer band 195, for example, the inner band 196 can have a height which is 0.8 times smaller than the height of the outer band 195. The gaps between the inner and outer bands 196, 195, respectively, and the outer wall 260b and inner wall 260a of the cover ring 212 serve to hinder and impede ingress of plasma species into this region.

The upper and lower shields 147, 182 are fabricated from a conductor, such as a metal, for example, aluminum or stainless steel. In one version, the upper shield 147 is made from aluminum and the lower shield 182 is made from stainless steel. In one version, the shields 147, 182 have exposed surfaces 198, 199, respectively, facing the plasma zone 177 in the chamber 100. The exposed surfaces 198, 199 are bead blasted to have a surface roughness of 175±75 microinches. The bead blasted surface is prepared in the same manner as the bead blasting process used for the exposed surface 217 of the deposition ring 208 as described above with suitable modifications to the grit size to achieve the desired roughness values.

The design of the components of the process kit 200 and the target 136 significantly increase the number of process cycles and process on-time that the process kit can be used in a sputtering chamber 100 without removing the process kit for cleaning in the sputtering of titanium. The components of the process kit 200 and target 136 are also designed to allow increased power and pressure in the sputtering zone of a chamber to yield higher deposition throughput by reducing the temperature in the darkspace region, which is near the upper shield 147 and target 136.

An exemplary version of a sputtering process chamber 100 capable of processing a substrate 104 is shown in FIG. 9. The chamber 100 comprises enclosure walls 179 that enclose a plasma zone 177 and include sidewalls 116, a bottom wall 120, and a ceiling 124. The chamber 100 can be a part of a multi-chamber platform (not shown) having a cluster of interconnected chambers connected by a robot arm mechanism that transfers substrates 104 between the chambers 177. In the version shown, the process chamber 100 comprises a sputtering chamber, also called a physical vapor deposition or PVD chamber, which is capable of sputter depositing titanium on a substrate 104. However, the chamber 100 can also be used for other purposes, such as for example, to deposit aluminum, copper, tantalum, tantalum nitride, titanium nitride, tungsten or tungsten nitride; thus, the present claims should not be limited to the exemplary embodiments described herein to illustrate the invention.

The chamber 100 comprises a substrate support 130 to support the substrate 104 which comprises a pedestal 134. The pedestal 134 has a substrate receiving surface 138 that receives and supports the substrate 104 during processing, the surface 138 having a plane substantially parallel to a sputtering surface 135 of an overhead sputtering target 136. The support 130 can also include an electrostatic chuck 132 to electrostatically hold the substrate 104 and/or a heater (not shown), such as an electrical resistance heater or heat exchanger. In operation, a substrate 104 is introduced into the chamber 100 through a substrate loading inlet (not shown) in the sidewall 116 of the chamber 100 and placed on the substrate support 130. The support 130 can be lifted or lowered to lift and lower the substrate onto the support 130 during placement of a substrate 104 on the support 130. The pedestal 134 can be maintained at an electrically floating potential or grounded during plasma operation.

During a sputtering process, the target 136, support 130, and upper shield 147 are electrically biased relative to one another by a power supply 148. The target 136, upper shield 147, support 130, and other chamber components connected to the target power supply 148 operate as a gas energizer 171 to form or sustain a plasma of the sputtering gas. The gas energizer 171 can also include a source coil (not shown) that is powered by the application of a current through the coil. The plasma formed in the plasma zone 177 energetically impinges upon and bombards the sputtering surface 135 of the target 136 to sputter material off the surface 135 onto the substrate 104.

The sputtering gas is introduced into the chamber 100 through a gas delivery system 160 that provides gas from a gas supply 169 via conduits 164 having gas flow control valves 166, such as a mass flow controllers, to pass a set flow rate of the gas therethrough. The gases are fed to a mixing manifold (also not shown) in which the gases are mixed to form a desired process gas composition and fed to a gas distributor 168 having gas outlets in the chamber 100. The process gas source 169 may comprise a non-reactive gas, such as argon or xenon, which is capable of energetically impinging upon and sputtering material from a target. The process gas source 169 may also include a reactive gas, such as one or more of an oxygen-containing gas and a nitrogen-containing gas, that are capable of reacting with the sputtered material to form a layer on the substrate 104. Spent process gas and byproducts are exhausted from the chamber 100 through an exhaust 170 which includes exhaust ports 172 that receive spent process gas and pass the spent gas to an exhaust conduit 174 having a throttle valve 176 to control the pressure of the gas in the chamber 100. The exhaust conduit 174 is connected to one or more exhaust pumps 178. Typically, the pressure of the sputtering gas in the chamber 100 is set to sub-atmospheric levels, such as a vacuum environment, for example, gas pressures of 1 mTorr to 400 mTorr.

The chamber 100 can also include a heat exchanger comprising a housing capable of holding a heat transfer fluid which is mounted abutting the backside surface of the target 136. The housing comprises walls which are sealed about the backside surface of the target. A heat transfer fluid, such as chilled deionized water 188, is introduced into the housing though an inlet and is removed from the housing through an outlet. The heat exchanger serves to maintain the target at lower temperatures to further reduce the possibility of forming erosion grooves and microcracks in the target.

The chamber can also include a magnetic field generator 102 comprising a plurality of rotatable magnets 156, 159 which are positioned about the backside surface of the backing plate 141 of the target 136. The rotatable magnets 156, 159 can include a set of magnets which include a central magnet 156 having a first magnetic flux or magnetic field orientation, and a peripheral magnet 159 with a second magnetic flux or magnetic field orientation. In one version, the ratio of the first magnetic flux to the second magnetic flux is at least about 1:2, for example, from about 1:3 to about 1:8, or even about 1:5. This allows the magnetic field from the peripheral magnets 159 to extend deeper into the chamber towards the substrate 104. In one example, the magnetic field generator 102 comprises a set of central magnets 156 having a first magnetic field orientation, surrounded by a set of peripheral magnets 159 having a second magnetic field orientation. For example, the second magnetic field orientation can be generated by positioning the peripheral magnets 159 so that their polarity direction is opposite to the polarity direction of the central magnets 156. To achieve uniform sputtering onto the substrate 104, in the version shown, the magnetic field generator comprises a motor 153 and axle 163 to rotate a circular plate 158 on which the magnets 156, 159 are mounted. The rotation system rotates the rotatable magnets 156, 159 at from about 60 to about 120 rpm, for example, about 80 to about 100 rpm. In one version, the magnets 156, 159 comprise NdFeB. The rotating magnets 156, 159 provide a rotating and changing magnetic field about the sputtering surface of the sputtering target 136 which affects sputtering rates from the target, while also circulating the heat transfer fluid in the housing of the heat exchanger.

To counteract the large amount of power delivered to the target 136, the back of the target 136 may be sealed to a backside coolant chamber 165. Chilled deionized water 188 or other cooling liquid is circulated through the interior of the coolant chamber 165 to cool the target 136. The magnetic field generator 102 is typically immersed in the cooling water 188, and the target rotation shaft 163 passes through the back chamber 165 through a rotary seal 181.

The chamber 100 is controlled by a controller 180 that comprises program code having instruction sets to operate components of the chamber 100 to process substrates 104 in the chamber 100. For example, the controller 180 can comprise program code that includes a substrate positioning instruction set to operate the substrate support 130 and substrate transport; a gas flow control instruction set to operate gas flow control valves 166 to set a flow of sputtering gas to the chamber 100; a gas pressure control instruction set to operate the throttle valve 174 to maintain a pressure in the chamber 100; a gas energizer control instruction set to operate the gas energizer 171 to set a gas energizing power level; a temperature control instruction set to control a temperature control system (not shown) in the support 134 or wall 179 to set temperatures of the substrate 104 or walls 179, respectively; and a process monitoring instruction set to monitor the process in the chamber 100.

The sputtering process can be used to deposit a layer comprising titanium or a titanium compound on a substrate. The titanium layers can be used by themselves, or in combination with other layers. For example, a sputtered titanium layer can be used as a barrier layer, e.g., Ti/TiN stacked layers are often used as liner barrier layers and to provide contacts to the source and drain of a transistor. In another example, a titanium layer is deposited on a silicon wafer and portions of the titanium layer in contact with the silicon are converted to titanium silicide layers by annealing. In another configuration, the diffusion barrier layer below a metal conductor, includes a titanium oxide layer formed by sputter depositing titanium on the substrate and then transferring the substrate to an oxidizing chamber to oxidize the titanium by heating it in an oxygen environment to form titanium oxide. Titanium oxide can also be deposited by introducing oxygen gas into the chamber while titanium is being sputtered. Titanium nitride can be deposited by reactive sputtering methods by introducing a nitrogen containing gas into the chamber while sputtering titanium.

The present invention has been described with reference to certain preferred versions thereof; however, other versions are possible. For example, the sputtering plate 137 and backing plate 141 of the target 136 can be made from other materials than those described herein, and can also have other shapes and sizes. The process kit 200 can also be used in other types of applications, as would be apparent to one of ordinary skill, for example, etching and CVD chambers. Other shapes, configurations, and fabrication materials can also be used to make the deposition ring 208, cover ring 212, and shield assembly 150. Therefore, the spirit and scope of the appended claims should not be limited to the description of the preferred versions contained herein.

What is claimed is:

1. A sputtering target for a sputtering chamber having a magnetic field generator that generates a rotating magnetic field in the sputtering chamber, the sputtering target comprising:

(a) a metal backing plate comprising:
  (i) a backside surface comprising an inner radius and an outer radius, and a plurality of curved grooves, each curved groove extending from the inner radius of the backing plate to the outer radius of the backing plate;
  (ii) a thermal conductivity of at least about 200 W/(m·K); and
  (iii) an electrical resistivity from about 2 to about 5 µohm cm; and
(b) a sputtering plate mounted on the backing plate, the sputtering plate comprising:
  (i) a cylindrical mesa having a plane comprising the sputtering surface; and
  (ii) an annular inclined rim surrounding the cylindrical mesa.

2. A sputtering target according to claim 1 wherein the backing plate comprises a thermal conductivity of from about 220 to about 400 W/(m·K).

3. A sputtering target according to claim 1 wherein the backing plate comprises an electrical resistivity from about 2.2 to about 4.1 µohm cm.

4. A sputtering target according to claim 1 wherein the backing plate comprises a copper-chrome alloy.

5. A sputtering target according to claim 4 wherein the copper-chrome alloy comprises C18000 or C18200.

6. A sputtering target according to claim 1 wherein the annular inclined rim is inclined relative to the plane of the cylindrical mesa by an angle of at least about 8°.

7. A sputtering target according to claim 1 further comprising a heat exchanger comprising a housing capable of holding a heat transfer fluid and a plurality of rotatable magnets in the housing.

8. A sputtering target according to claim 1 wherein the sputtering plate comprises titanium.

9. A sputtering chamber comprising the sputtering target of claim 1, the sputtering chamber comprising:
  (1) the sputtering target of claim 1 mounted therein;
  (2) a substrate support facing the sputtering target;
  (3) a gas distributor to introduce a gas into the sputtering chamber;
  (4) a gas energizer to energize the gas to form a plasma to sputter the sputtering target;
  (5) a gas exhaust port to exhaust gas from the sputtering chamber; and
  (6) a magnetic field generator that generates a rotating magnetic field in the sputtering chamber.

10. A sputtering target for a sputtering chamber having a magnetic field generator that generates a rotating magnetic field in the sputtering chamber, the sputtering target comprising:
  (a) a metal backing plate comprising a backside surface comprising an inner radius and an outer radius, and a plurality of curved grooves, each curved groove extending from the inner radius of the backing plate to the outer radius of the backing plate; and
  (b) a sputtering plate mounted on the backing plate, the sputtering plate comprising:
    (i) a cylindrical mesa having a plane comprising the sputtering surface; and
    (ii) an annular inclined rim surrounding the cylindrical mesa.

11. A sputtering target according to claim 10 wherein the backing plate comprises at least about 4 grooves.

12. A sputtering target according to claim 10 wherein the backing plate comprises a thermal conductivity of at least about 200 W/(m·K) and an electrical resistivity from about 2 to about 5 µohm cm.

13. A sputtering chamber comprising the sputtering target of claim 10, the sputtering chamber comprising:
  (1) the sputtering target of claim 10 mounted therein;
  (2) a substrate support facing the sputtering target;
  (3) a gas distributor to introduce a gas into the sputtering chamber;
  (4) a gas energizer to energize the gas to form a plasma to sputter the sputtering target;
  (5) a gas exhaust port to exhaust gas from the sputtering chamber, and;
  (6) a magnetic field generator that generates a rotating magnetic field in the sputtering chamber.

14. A sputtering chamber comprising:
  (a) a sputtering target comprising a metal backing plate comprising:
    a thermal conductivity of at least about 200 W/(m·K),
    an electrical resistivity from about 2 to about 5 µohm cm,
    a front surface,
    a backside surface comprising a plurality of curved grooves that each extend from an inner radius of the backing plate to an outer radius of the backing plate, and
    a sputtering plate mounted on the front surface of the backing plate, the sputtering plate comprising a sputtering surface;
  (b) a substrate support facing the sputtering target;
  (c) a heat exchanger comprising a housing about the backside surface of the sputtering target, the housing capable of holding a heat transfer fluid;
  (d) a magnetic field generator comprising a plurality of rotatable magnets positioned about the backside surface of the backing plate, the magnetic field generator capable of providing a rotating magnetic field about the sputtering surface;
  (e) a gas distributor to introduce a gas into the sputtering chamber;
  (f) a gas energizer to energize the gas to form a plasma to sputter the sputtering target; and
  (g) a gas exhaust port to exhaust gas from the sputtering chamber,
wherein each of the plurality of curved grooves extends from about 0.3 R to about 0.8 R, where R is the radius of the backside surface.

15. A sputtering chamber according to claim 14 wherein the magnetic field generator comprises a plurality of rotatable magnets, the rotatable magnets having different magnetic flux or magnetic field orientation.

16. A sputtering chamber according to claim 14 wherein the rotatable magnets are in the housing of the heat exchanger.

17. A sputtering target according to claim 1 wherein the curved grooves are curved radial grooves.

18. A sputtering target according to claim 17 wherein the curved radial grooves are convex shaped relative to the direction of rotation of the rotating magnetic field.

19. A sputtering target according to claim 10 wherein the curved grooves are curved radial grooves.

20. A sputtering target according to claim 19 wherein the curved radial grooves are convex shaped relative to the direction of rotation of the rotating magnetic field.

21. A sputtering chamber according to claim 14 wherein the curved grooves are curved radial grooves.

22. A sputtering target according to claim 21 wherein the curved radial grooves are convex shaped relative to the direction of rotation of the rotating magnetic field.

23. A sputtering target according to claim 1 wherein the curved grooves comprise a continuous sidewall surface.

24. A sputtering target according to claim 10 wherein the curved grooves comprise a continuous sidewall surface.

* * * * *